United States Patent
Shiraishi et al.

(10) Patent No.: US 6,452,280 B1
(45) Date of Patent: Sep. 17, 2002

(54) FLIP CHIP SEMICONDUCTOR APPARATUS WITH PROJECTING ELECTRODES AND METHOD FOR PRODUCING SAME

(75) Inventors: Tsukasa Shiraishi; Yoshihiro Bessho, both of Osaka (JP)

(73) Assignee: Matsushita Electric Industrial Co., Ltd., Kadoma (JP)

(*) Notice: Subject to any disclaimer, the term of this patent is extended or adjusted under 35 U.S.C. 154(b) by 0 days.

(21) Appl. No.: 09/117,695

(22) PCT Filed: Mar. 5, 1997

(86) PCT No.: PCT/JP97/00672

§ 371 (c)(1),
(2), (4) Date: Aug. 4, 1998

(87) PCT Pub. No.: WO97/33313

PCT Pub. Date: Sep. 12, 1997

(30) Foreign Application Priority Data

Mar. 6, 1996 (JP) ............................................. 8-049065

(51) Int. Cl.⁷ .......................... H01L 23/52; H01L 21/60; H01L 23/48; H01L 23/50
(52) U.S. Cl. ...................... 257/778; 257/737; 257/738; 257/686; 257/493; 257/779; 341/779
(58) Field of Search ................................ 257/737, 738, 257/734, 777, 778, 779, 686, 693, 678, 468; 361/774

(56) References Cited

U.S. PATENT DOCUMENTS

| | | | |
|---|---|---|---|
| 5,001,542 A | 3/1991 | Tsukagoshi et al. | |
| 5,336,547 A | 8/1994 | Kawakita et al. | |
| 5,436,503 A | 7/1995 | Kunitomo et al. | .......... 257/737 |
| 5,578,527 A | 11/1996 | Chang et al. | |

(List continued on next page.)

FOREIGN PATENT DOCUMENTS

| | | |
|---|---|---|
| DE | 296 385 | 11/1991 |
| EP | 0 242 025 | 10/1987 |
| EP | 320 244 | 6/1989 |
| EP | 0 645 805 | 3/1995 |
| EP | 720 226 | 7/1996 |
| JP | 63-60540 | 3/1988 |

(List continued on next page.)

OTHER PUBLICATIONS

Jul. 28, 1999 Communication from EPO and attached Search Report.
Jan. 15, 1980 "IC KA Jissou Gijutsu", edited by Japan Microelectronics Association, published by Institute for Industrial Research, pp. 80–85. (with partial English translation).

*Primary Examiner*—Alexander O. Williams
(74) *Attorney, Agent, or Firm*—Merchant & Gould P.C.

(57) ABSTRACT

A semiconductor apparatus in which the height of the projected electrode (4) formed on the semiconductor element (1) is deformed plastically so as to unify the distance of the protruding surface of the projected electrode (4) and the surface of the electrode terminal (7) at the side of the circuit substrate (5), and the semiconductor element and the circuit substrate are connected electrically with reliability. A method for producing the semiconductor apparatus also is disclosed. After the semiconductor element (1) is positioned on the predetermined part of the circuit substrate (5), the projected electrode (4) is deformed plastically by pushing the semiconductor element (1) from the back and the height of the projected electrode (4) is processed appropriately. According to the method for producing the semiconductor apparatus, even if there is irregularity of the height of the surface of the electrode terminal (7) formed on the circuit substrate (5) which connects with the semiconductor element (1), the semiconductor element (1) and the circuit substrate (5) can be connected electrically with reliability.

18 Claims, 11 Drawing Sheets

U.S. PATENT DOCUMENTS

| | | | |
|---|---|---|---|
| 5,611,884 A | | 3/1997 | Bearinger et al. |
| 5,640,051 A | * | 6/1997 | Tomura et al. ............. 257/778 |
| 5,734,199 A | * | 3/1998 | Kawakita et al. ........... 257/737 |
| 5,796,591 A | | 8/1998 | Dalal et al. |
| 5,801,446 A | * | 9/1998 | DiStefano et al. .......... 257/778 |
| 5,808,319 A | * | 9/1998 | Gardner et al. ............... 257/67 |
| 5,808,878 A | * | 9/1998 | Saito et al. ................. 361/818 |
| 5,844,320 A | | 12/1998 | Ono et al. |
| 5,874,780 A | * | 2/1999 | Murakami ................... 257/775 |
| 5,907,187 A | * | 5/1999 | Koiwa et al. ............... 257/737 |
| 5,912,505 A | * | 6/1999 | Itoh et al. ................... 257/737 |
| 5,914,536 A | * | 6/1999 | Shizuki et al. .............. 257/774 |
| 5,959,362 A | * | 9/1999 | Yoshino ...................... 257/778 |
| 6,010,769 A | * | 1/2000 | Sasaoka et al. ............. 428/209 |

FOREIGN PATENT DOCUMENTS

| | | |
|---|---|---|
| JP | 63-152135 | 6/1988 |
| JP | 63-289824 | 11/1988 |
| JP | 1-7542 | 1/1989 |
| JP | 1-39043 | 2/1989 |
| JP | 2-28340 | 1/1990 |
| JP | 2-177546 | 7/1990 |
| JP | 3-209831 | 9/1991 |
| JP | 3-291950 | 12/1991 |
| JP | 4-6841 | 1/1992 |
| JP | 4-33348 | 2/1992 |
| JP | 4-99040 | 3/1992 |
| JP | 4-137541 | 5/1992 |
| JP | 4-137630 | 5/1992 |
| JP | 4-144145 | 5/1992 |
| JP | 5-166879 | 2/1993 |
| JP | 5-62977 | 3/1993 |
| JP | 5-144888 | 6/1993 |
| JP | 5-166879 | 7/1993 |
| JP | 5-283414 | 10/1993 |
| JP | 5-144821 | 11/1993 |
| JP | 6-209028 | 7/1994 |
| JP | 6-302649 | 10/1994 |
| JP | 7-193101 | 7/1995 |
| JP | 7-321148 | 12/1995 |
| JP | 8-31875 | 2/1996 |
| JP | 8-55874 | 2/1996 |

\* cited by examiner

FLIP CHIP SEMICONDUCTOR APPARATUS WITH PROJECTING ELECTRODES AND METHOD FOR PRODUCING SAME

TECHNICAL FIELD

The present invention relates to a semiconductor apparatus. In particular, the present invention relates to a semiconductor apparatus in which a flip-chip packaging technique is used and a method for producing the same.

BACKGROUND ART

Recently the semiconductor element has become increasingly integrated, the size of the semiconductor apparatus has become miniaturized and the pitch between the connecting terminals has become narrower. Under these circumstances, the semiconductor apparatus in which the flip-chip packaging technique is used has been developed more and more. Hereinafter, one example of semiconductor apparatus in which the flip-chip packaging technique is used will be explained, referring to the figures.

Figure 9:
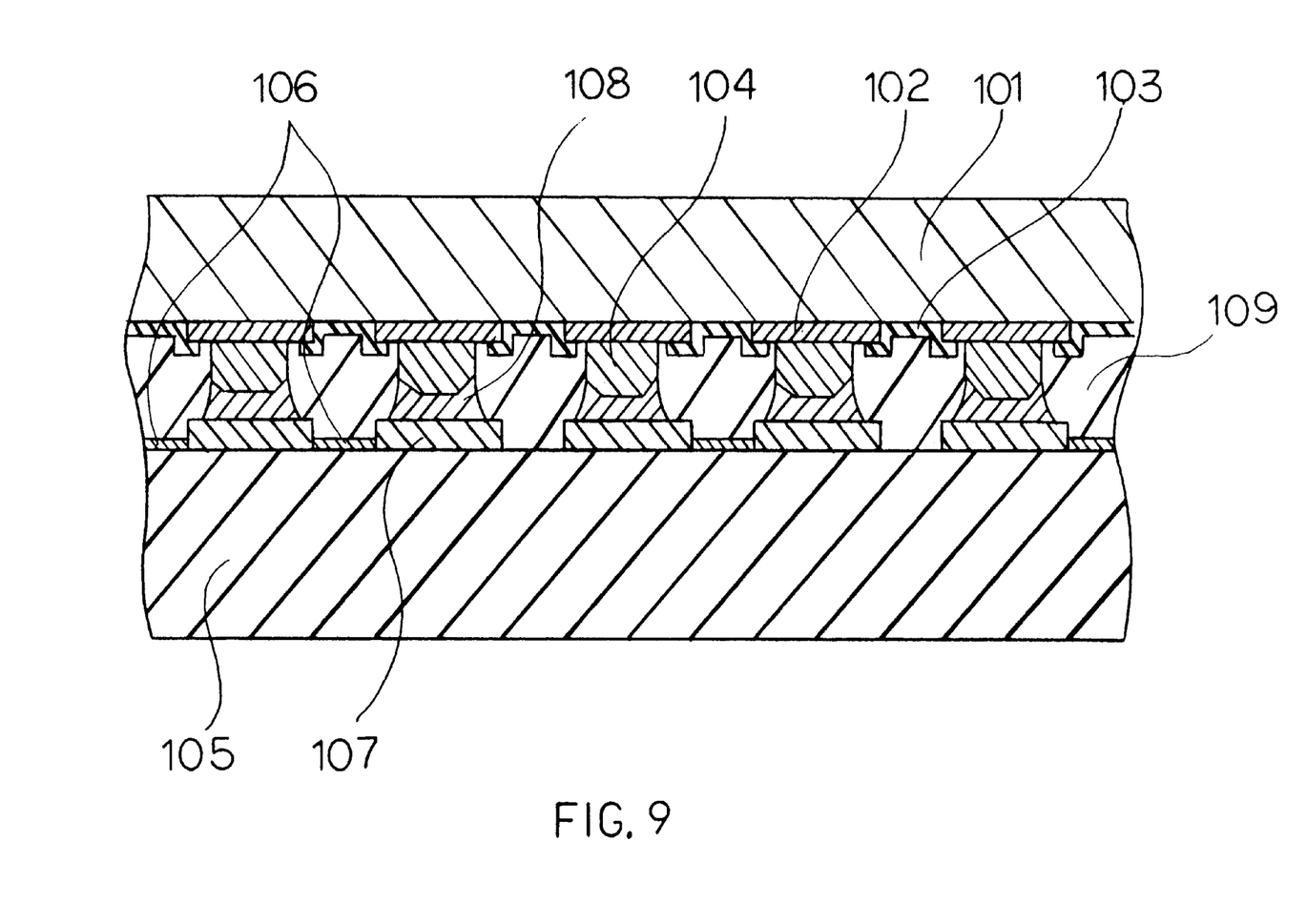
FIG. 9 is a sectional view showing one example of semiconductor apparatus in which conventional flip-chip packaging technique is used.

FIG. 9 is a sectional view showing a semiconductor in which the flip-chip packaging technique is used. An aluminum electrode terminal 102 is formed on the semiconductor element 101. The area of the semiconductor element other than where the aluminum electrode terminal 102 is formed is covered with an insulating film 103 composed of Si oxide film, Si nitrogen film and the like. On the aluminum electrode terminal 102, a projected electrode 104 composed of conductive metallic material such as Au or Cu and the like is formed. On the other hand, a desired circuit pattern 106 and an electrode terminal 107 are formed on the principal surface of circuit substrate 105 composed of insulating material such as resin, ceramic or glass and the like. The electrode terminal 107 is connected to the circuit pattern 106. In flip-chip packaging, the electrode terminal 107 connects electrically with the semiconductor element 101. A projected electrode 104 is electrically connected with the electrode terminal 107 by the conductive adhesive 108. The conductive adhesive 108 contains a powder of conductive metallic material such as Ag, Cu or Ni and the like in the resin. The insulating resin 109 is filled in the space between the semiconductor element 101 and the circuit substrate 105. When the insulating resin 109 is hardened, the semiconductor element 101 and the circuit substrate 105 are bonded by the hardening shrinkage force of the insulating resin 109, and are attracted powerfully and fixed. Consequently, the mechanical strength of connecting the semiconductor element 101 and the circuit substrate 105 of the semiconductor apparatus is enhanced and a stable fixing can be maintained.

Figure 10:
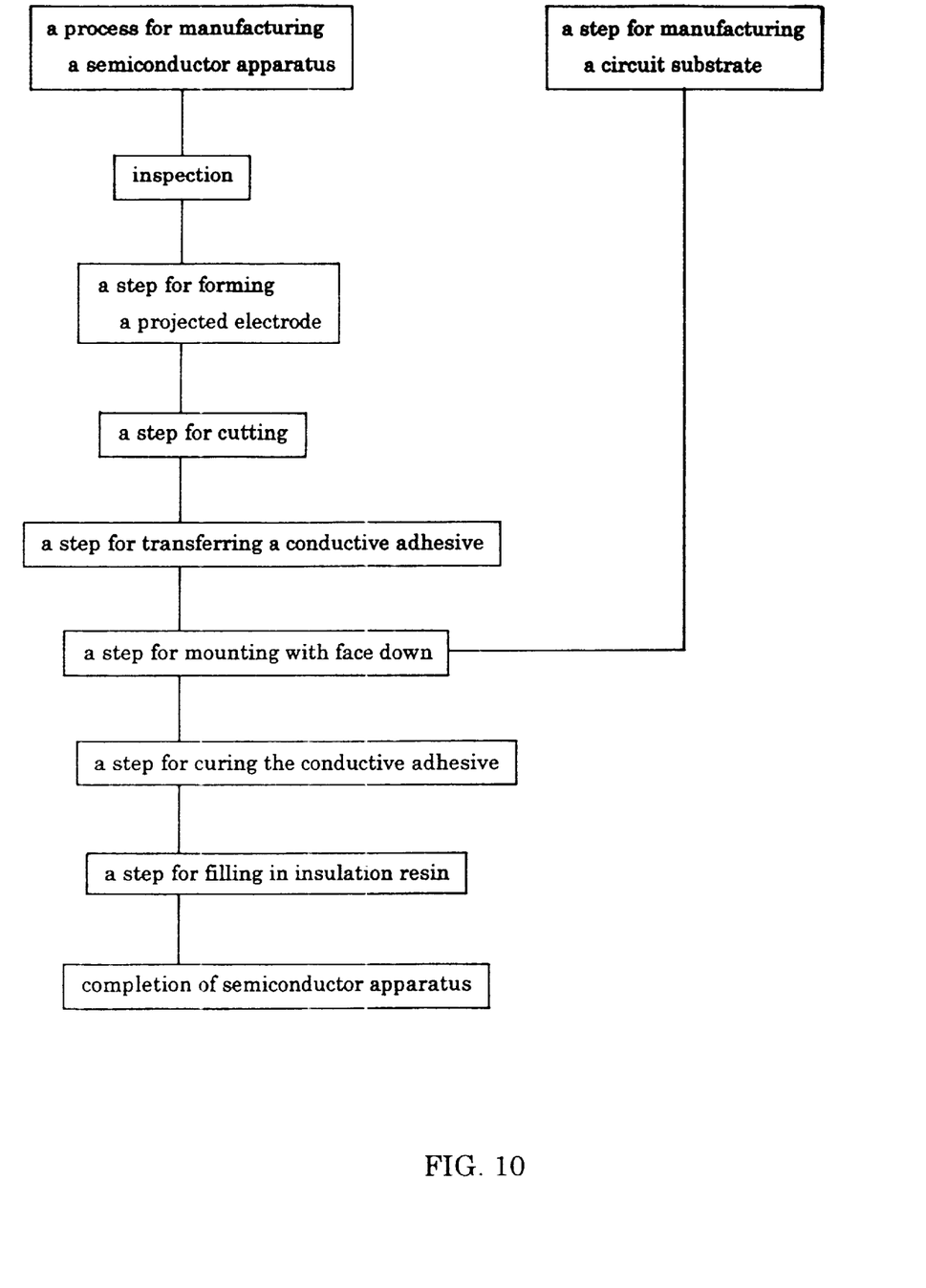
FIG. 10 is a flow chart showing a process of producing a semiconductor apparatus in which the conventional flip-chip packaging technique is used.

A method for producing the conventional semiconductor apparatus as above-mentioned will be explained referring to FIG. 10, which is a flow chart showing the process of producing the semiconductor apparatus. First, a semiconductor element 101, on which a desired element, a wiring and an insulating film 103 are formed by the normal process of producing the semiconductor, is produced. Then the semiconductor wafer, on which a numerous pieces of semiconductor element 101 are formed, is produced. Then, the quality of the semiconductor element 101 is checked by electrical inspection, that is, by contacting the probe, and the projected electrode 104 is formed. After that, the semiconductor wafer is cut into individual semiconductor elements 101. On the other hand, in advance, a desired circuit pattern 106 and an electrode terminal 107 are formed using conductive material such as conductive metal, e.g. Au or Cu and the like on the circuit substrate 105 which is composed of the insulating material. Then the semiconductor element 101 is positioned on the circuit substrate 105 with its face down via conductive adhesive 108 so that the predetermined electrode terminal 107 can be connected electrically with the projected electrode 104. After that, the conductive adhesive 108 is hardened by heat treatment and electrical inspection is conducted to confirm the acting state. After the normal acting state is confirmed, the liquid insulating resin such as epoxy-based resin is filled in the space between the semiconductor element 101 and the circuit substrate 106 by capillary action. After the insulating resin is filled in the space, the insulating resin 109 is hardened by heat treatment and the like, and accordingly the flip-chip packaging is completed.

The semiconductor apparatus in which the flip-chip packaging technique is used was produced according to the above-mentioned production processes.

Figure 11:
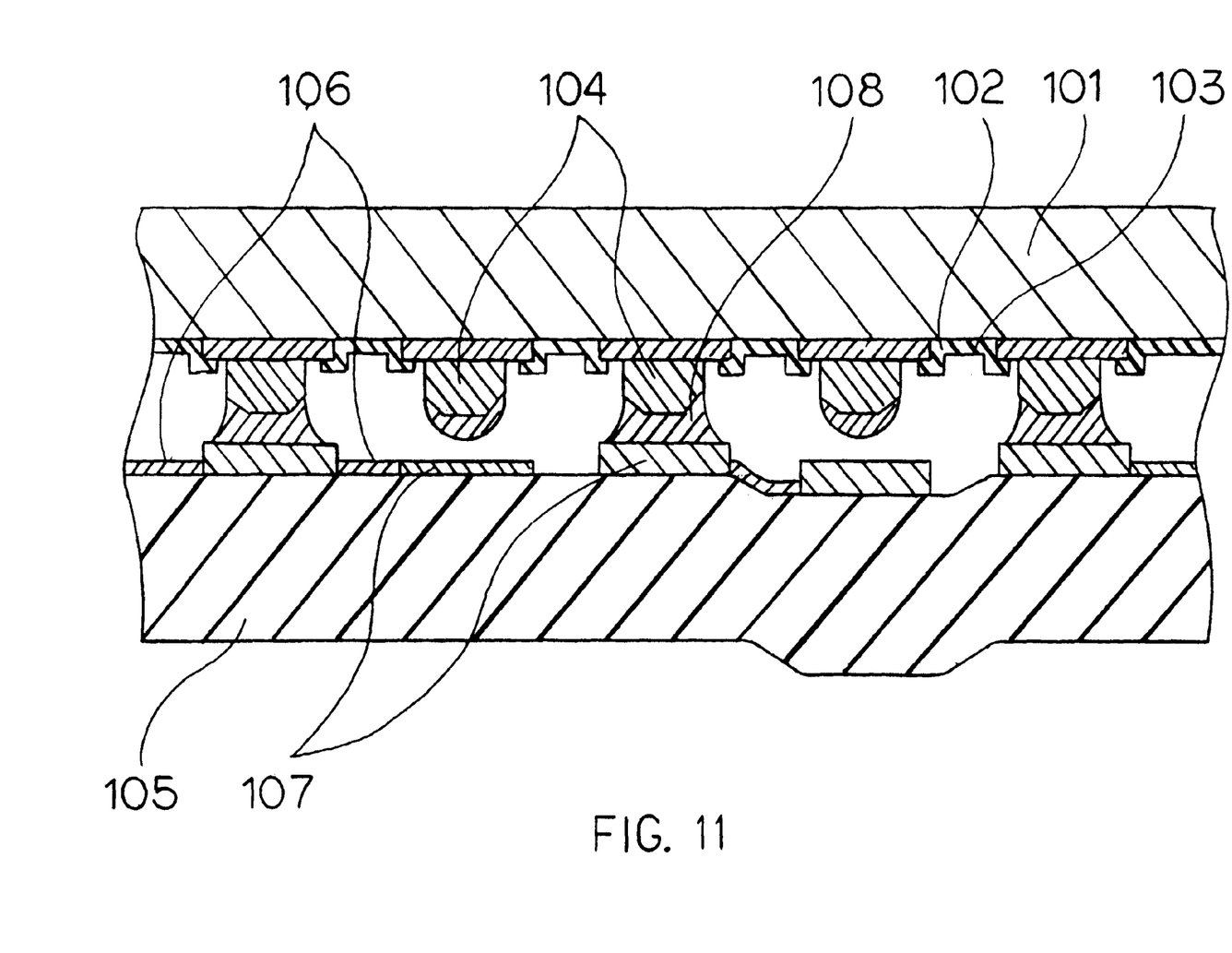
FIG. 11 is a sectional view showing one example of conventional semiconductor apparatus.

However, according to the above-mentioned conventional semiconductor apparatus and the method for producing the conventional semiconductor apparatus as shown in FIG. 11, irregularity of the flatness accuracy of the surface of the circuit substrate 105 is caused by the warp, swell and the like in some parts of the circuit substrate 105. Further, there is also the irregularity of the film thickness accuracy of the electrode terminal 107. Consequently, the protruding surface of the electrode terminal 107 at the side of the circuit substrate in the region of one semiconductor element is not positioned at the horizontal surface respectively, and therefore an irregularity of the position of the protruding surface of the electrode terminal 107 at the side of the circuit substrate in the direction of height of the protruding surface is caused.

Consequently, in mounting the semiconductor element 101 with face down, the size of the space between the semiconductor element 101 and the circuit substrate 105 in the concave portion of the circuit substrate 107 is larger than that of other parts of the circuit substrate 107. As a result, the conductive adhesive 108 can not reach to the protruding surface of the electrode terminal 107 positioned in the concave portion of the circuit substrate. Consequently, the electrical connection failure is caused.

DISCLOSURE OF INVENTION

It is an object of the present invention to provide a semiconductor apparatus which is stable in quality and has good productivity, and a method for producing the same by connecting electrically the semiconductor element and the circuit substrate more reliably.

In order to achieve the above-mentioned objects, in the semiconductor apparatus of this invention, the flip-chip packaging technique is used for connecting electrically a semiconductor element and a circuit substrate via a projected electrode composed of conductive metallic material formed on an electrode terminal, which is formed on the surface of the semiconductor element where the element is formed, a conductive adhesive and an electrode terminal on the circuit substrate, wherein the individual projected electrode is deformed plastically in the direction of the height so that the distance between a protruding surface of an individual projected electrode and an opposing surface of the individual electrode terminal via the conductive adhesive is unified.

According to the semiconductor apparatus in this invention, the height of the projected electrode is processed appropriately so that the distance between the protruding surface of the individual projected electrode and the opposing surface of the individual electrode terminal via the conductive adhesive is uniform. Consequently, the semiconductor element can be connected electrically with the circuit substrate reliably.

It is preferable that in the semiconductor apparatus, the material of the projected electrode is at least one metallic material selected from the group consisting of Au and Cu.

Furthermore, it is preferable that the distance between the protruding surface of the individual projected electrode and the opposing surface of the individual electrode terminal via the conductive adhesive is in a range of 1 µm to 10 µm.

Furthermore, it is preferable that the flip-chip packaging technique is used for connecting the semiconductor element and the circuit substrate via the electrode terminal formed on the semiconductor element where the element is formed, the conductive adhesive and the projected electrode composed of the conductive metallic material formed on the electrode terminal on the circuit substrate.

In the preferred semiconductor apparatus in which the projected electrode is formed at the side of the circuit substrate, it is preferable that a barrier layer composed of conductive metallic laminated film is formed on the electrode terminal on the semiconductor element where the element is formed.

According to the preferred semiconductor apparatus on which the barrier layer is formed, the corrosion of the electrode terminal formed on the semiconductor element where the element is formed can be prevented.

In the semiconductor apparatus, it is preferable that the height of the projection of the projected electrode is substantially uniform.

In the semiconductor apparatus whose height of the projection of the projected electrode is substantially uniform, it is preferable that the height of the protruding surface of the individual projected electrode is unified by pushing the projected electrode on a flat surface of a hard material before the projected electrode is bonded with conductive adhesive.

In the semiconductor apparatus in which the height of the protruding surface of the individual projected electrode is unified by pushing the projected electrode on the flat surface of the hard material, it is preferable that the pressure on the protruding surface of the projected electrode which is caused by pushing on the flat surface of the hard material is in a range of $1.5 \times 10^8$ to $5.0 \times 10^8$ N/m$^2$.

Furthermore, it is preferable that the variation in flatness of the hard material is 4 µm or less over a distance of 20 mm.

According to a first aspect of the method for producing the semiconductor apparatus, a projected electrode is formed on the semiconductor element where the element is formed, a conductive adhesive is transferred on the vertex of the projected electrode and the semiconductor element is pressured from the back when the semiconductor element is mounted on the circuit substrate with its face down. According to that, the projected electrode formed on the semiconductor element is deformed plastically to unify the distance between the protruding surface of the individual projected electrode formed on the semiconductor element and the opposing surface of the individual electrode terminal at the side of the circuit substrate.

According to the first aspect of the method for producing the semiconductor apparatus, the height of the projected electrode can be processed appropriately so that the distance between the protruding surface of the individual projected electrode and the opposing surface of the individual electrode terminal via the conductive adhesive can be unified. As a result, the semiconductor apparatus with high reliability can be produced easily and at a low cost.

In the first aspect of the method for producing the semiconductor apparatus, it is preferable that the pressure on the protruding surface of the projected electrode caused by pushing the semiconductor element from the back is in a range of $1.5 \times 10^8$ to $5.0 \times 10^8$ N/m$^2$.

Furthermore, it is preferable that after the projected electrode formed on the semiconductor element is deformed plastically, the conductive adhesive is transferred to the vertex of the individual projected electrode formed on the semiconductor element and the semiconductor element is mounted on the circuit substrate with face down again.

In the method for producing the preferred semiconductor apparatus in which the projected electrode is deformed plastically, and then the semiconductor element is mounted on the circuit substrate again, the semiconductor element is not pressured substantially when the semiconductor element is mounted on the circuit substrate its with face down. Therefore the shift of the position of the semiconductor element and the circuit substrate can be prevented.

According to a second aspect of the method for producing the semiconductor apparatus, after a projected electrode is formed on the electrode terminal formed on the circuit substrate, the height of the protruding surface of the individual projected electrode is unified by pushing the projected electrode to the flat surface of the hard material, the conductive adhesive is transferred to the vertex of the individual projected electrode and the semiconductor element is mounted on the circuit substrate with its face down.

According to the second aspect of the method for producing the semiconductor apparatus, a step of pressuring the semiconductor element is not present. Therefore the damage inflicted on the semiconductor element can be decreased.

In the second aspect of the method for producing the semiconductor apparatus, it is preferable that the pressure which is caused by pushing the projected electrode to the flat surface of the hard material to apply to the protruding surface of the projected electrode is in a range of $1.5 \times 10^8$ to $5.0 \times 10^8$ N/m$^2$.

Furthermore, it is preferable that the variation in flatness of the hard material is 4 µm or less over a distance of 20 mm.

BEST MODE FOR CARRYING OUT THE INVENTION

Hereinafter, an example of a semiconductor apparatus of this invention and a method for producing the same will be explained referring to figures.

EXAMPLE 1

Figure 1:
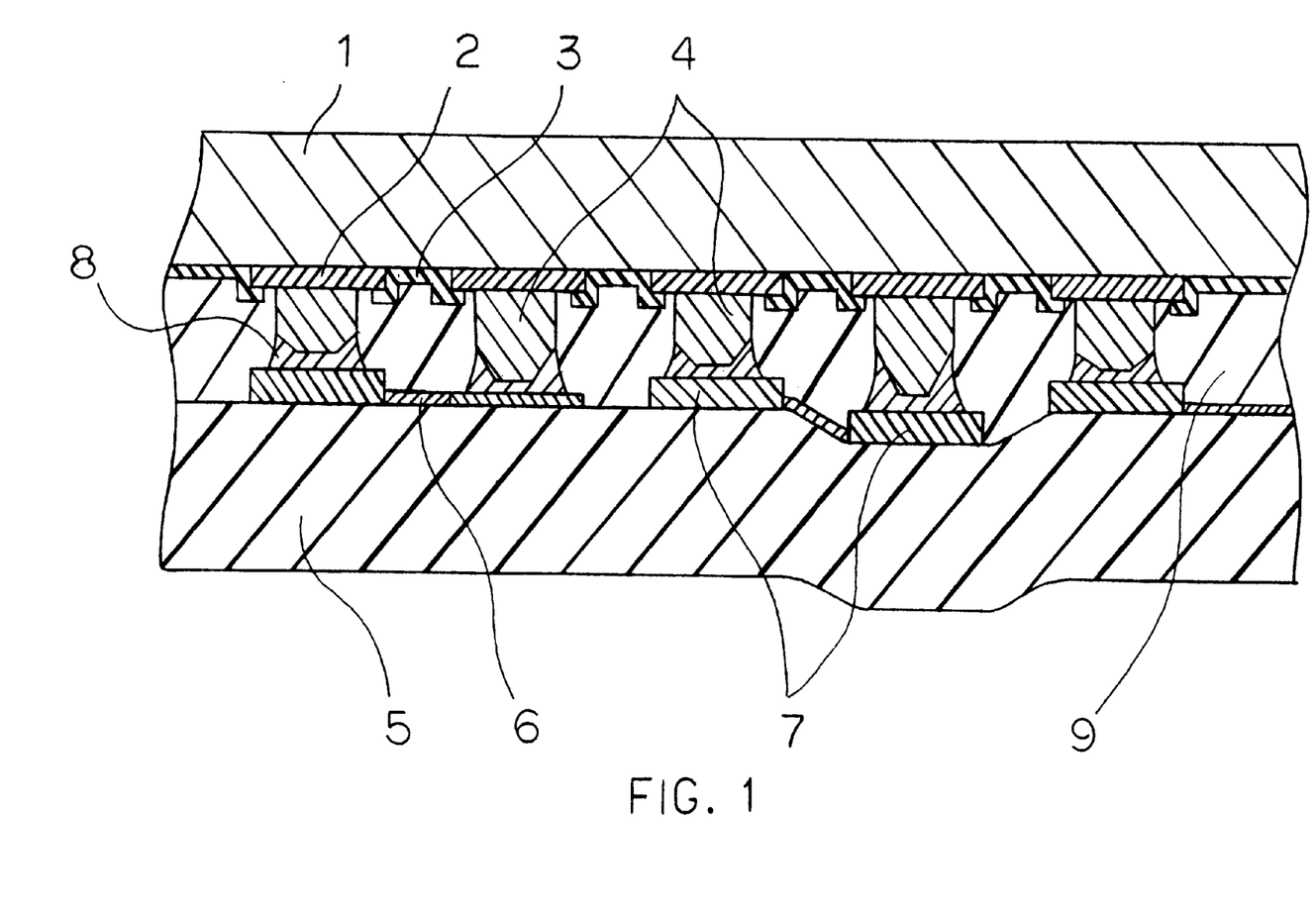
FIG. 1 is a sectional view showing a semiconductor apparatus in Example 1 of this invention.

FIG. 1 is a sectional view showing a semiconductor apparatus in Example 1 of this invention. As shown in FIG. 1, an aluminum electrode terminal 2 is formed on the surface of semiconductor element 1 where the element is formed. The area of the semiconductor element 1 other than where the aluminum electrode terminal 2 is formed is covered with an insulating film 3 composed of Si oxide film, Si nitrogen film and the like.

On the aluminum electrode terminal 2, a projected electrode 4 composed of conductive metallic material such as Au or Cu and the like is formed. On the other hand, a desired circuit pattern 6 and an electrode terminal 7 are formed on a circuit substrate 5 composed of insulating material such as resin, ceramic or glass and the like. The electrode terminal 7 is connected to the circuit pattern 6. In flip-chip packaging, the electrode terminal 7 connects electrically with the semiconductor element 1. A conductive adhesive 8 contains the powder of conductive metallic material such as Ag, Cu or Ni and the like in the resin. The insulating resin 9 is filled in the space between the semiconductor element 1 and the circuit substrate 5.

When the insulating resin 9 is hardened, the semiconductor element 1 and the circuit substrate 5 are bonded by the hardening shrinkage force of the insulating resin 9, and are attracted powerfully and fixed. Consequently, the mechanical strength of connecting the semiconductor element 1 and the circuit substrate 5 of the semiconductor apparatus is enhanced and the stable fixing can be maintained.

As shown in FIG. 1, the height of the projected electrode 4 is processed according to the height of the respective electrode terminals 7 formed on the circuit substrate 5. That is, there is the irregularity of the flat accuracy of the principal surface of the circuit substrate 5 and the film thickness accuracy of the electrode terminal 7. Consequently, the irregularity of the position of the electrode terminal 7 in the direction of height of the protruding surface is caused. The height of the projected electrode 4 is lowered by plastic deformation in accordance with the irregularity respectively. In this case, the irregularity of the height of the projected electrode 4 which is pre-deformed plastically is smaller than that of the position of the electrode terminal 7 in the direction of height of the protruding surface, and the height is constant substantially. Consequently, the amount of the change of the height of the projected electrode 4 caused by plastic deformation is different based on the position of the electrode terminal 7 in the direction of height of the protruding surface. Concretely, when the distance between the protruding surface of the electrode terminal 7 and the semiconductor element 1 is shorter, the amount of change of height of the projected electrode 4 becomes larger.

As a result, the distance between protruding surface of the projected electrode 4 formed at the side of the semiconductor element 1 and the surface of the electrode terminal 7 formed at the side of the circuit substrate 5 becomes uniform. It is preferable that the distance is in a range of 1 μm to 10 μm. It is more preferable that the distance is about 5 μm. Consequently, the junction layer composed of conductive adhesive 8 which is transferred on the vertex of the projected electrode 4 reliably reaches the surface of the electrode terminal 7 at the side of the circuit substrate 5 and as a result, the electrical connecting failure can be prevented.

Figure 2:
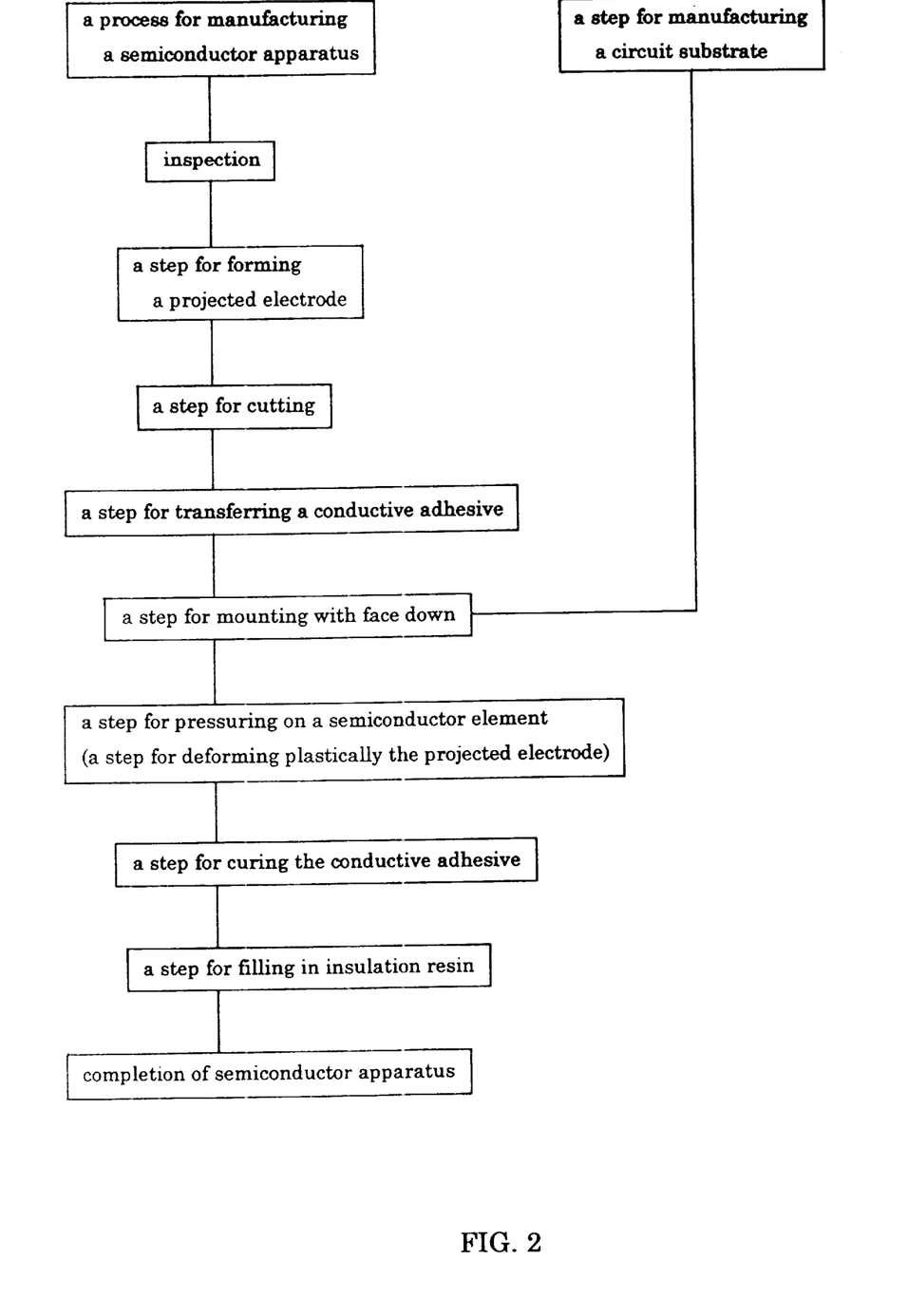
FIG. 2 is a flow chart showing the process of producing the semiconductor apparatus in Example 1.

Next, a method for producing the semiconductor apparatus in Example 1 will be explained referring to FIGS. 2 and 3. FIG. 2 is a flow chart showing the process of producing the semiconductor apparatus in Example 1. As shown in FIG. 2, in the same way as that of conventional process, a semiconductor element 1 is formed on the surface where the element is formed. Then, a projected electrode 4 composed of Au is formed on the surface of the aluminum electrode terminal 2 by a ball bonding technique and the semiconductor wafer is cut into individual semiconductor elements 1. After that, the required amount of conductive adhesive 8 is transferred only to the vertex of the projected electrode 4, and the projected electrode 4 is positioned on the predetermined part of the circuit substrate 5 on which a desired circuit pattern 6 and an electrode terminal 7 are formed in advance. The projected electrode 4 is pressured from the back of the semiconductor element 1 to cause plastic deformation of the projected electrode 4 and the process to make the height of the projected electrode 4 appropriate is conducted. Finally, after the conductive adhesive 8 is hardened by heat treatment, the normal action is confirmed by the electrical inspection, the liquid epoxy based insulating resin 9 is filled in the space between the semiconductor element 1 and the circuit substrate 6 and is hardened. As a result, a semiconductor apparatus is produced.

Figure 3A:
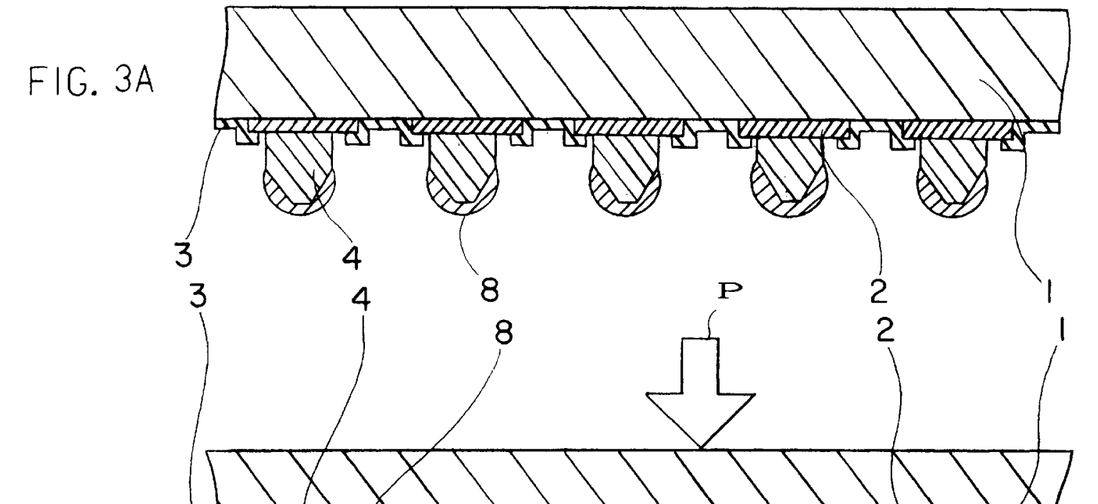
FIG. 3A is a sectional view showing a semiconductor apparatus in the step of transferring conductive adhesive in the process of producing a semiconductor apparatus shown in FIG. 2.
Figure 3B:
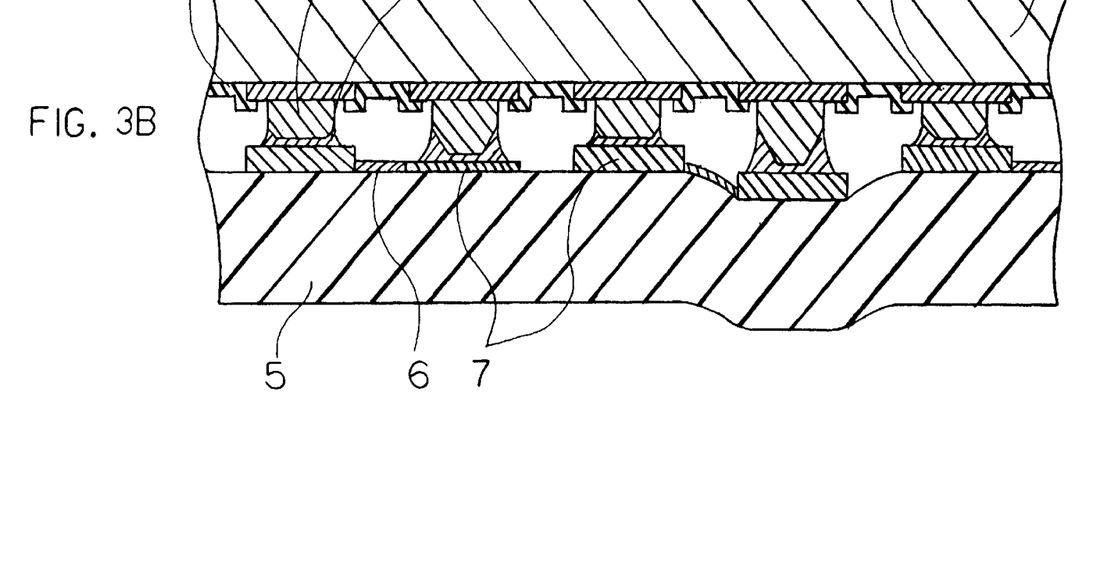
FIG. 3B is a sectional view showing a semiconductor apparatus in the step of mounting and that of pressuring the semiconductor element.

FIG. 3 is a figure showing a step of transferring conductive adhesive and that of pressuring the semiconductor element in the process of producing a semiconductor apparatus as shown in FIG. 2. The reference number used in FIG. 3 is the same as that used in FIG. 1. FIG. 3A is a sectional view showing a semiconductor apparatus in the step of transferring conductive adhesive in the process of producing a semiconductor apparatus. FIG. 3B is a sectional view showing a semiconductor apparatus in the step of mounting and that of pressuring the semiconductor element. As shown in FIG. 3A, the required amount of conductive adhesive 8 is transferred only to the vertex of the projected electrode 4. As shown in FIG. 3B, the semiconductor element 1 is positioned at the predetermined part of the circuit substrate 5 with its face down, and the pressure P is applied from the back of the semiconductor element 1 to cause plastic deformation of the projected electrode 4. The process is continued to make the height of the projected electrode 4 appropriate. Accordingly, the step of mounting with face down method is completed. It is preferable that the pressure applied from the back of the semiconductor element 1 is in a range of $1.5 \times 10^8$ to $5.0 \times 10^8$ N/m². When a pressure in the above-mentioned range is applied, the distance between the protruding surface of the projected electrode 4 and the surface of the electrode terminal surface 7 can be unified in a range of 1 μm to 10 μm.

Furthermore, a projected electrode 4 may be formed by the transferring bump technique in which the surface of the aluminum electrode terminal 2 is pushed by the block of the conductive metallic material such as Au or Cu and the like which is produced in advance, and then, pressure, heat or ultrasonic vibration is applied to attach the block of the conductive metallic material to the surface of the aluminum electrode terminal 2.

Furthermore, a projected electrode 4 may be formed by depositing the conductive metallic material on the aluminum electrode terminal 2 by electroless plating or electrolytic plating.

As above-mentioned, according to the method for producing the semiconductor apparatus in Example 1, the step of pressuring the projected electrode and that of mounting the semiconductor element can be conducted at the same time. As a result, in comparison with the conventional process of producing the semiconductor apparatus, the step also can be simplified.

EXAMPLE 2

Figure 4:
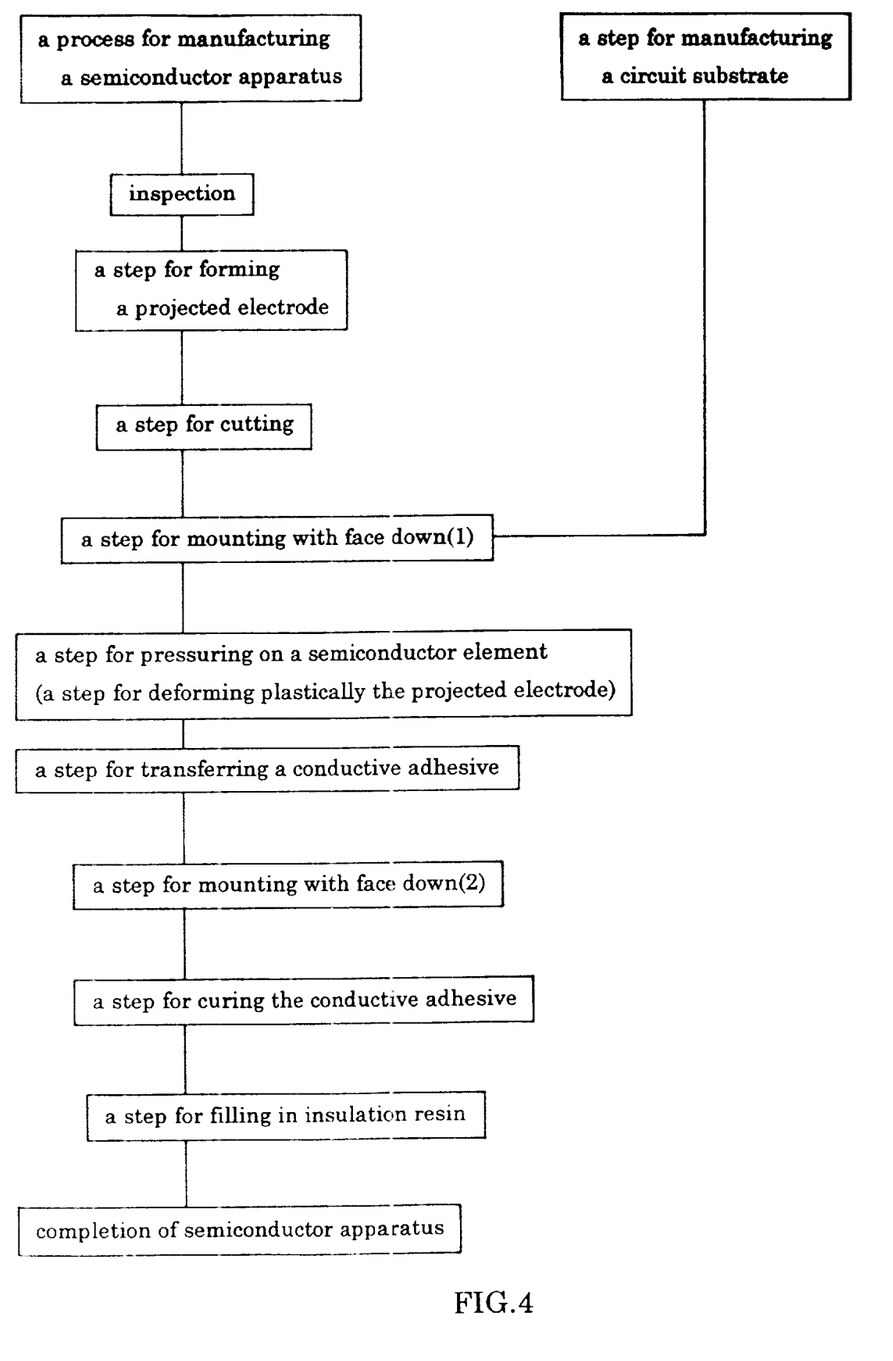
FIG. 4 is a flow chart showing a process of producing the semiconductor apparatus in Example 2.

A method for producing the semiconductor apparatus in Example 2 will be explained referring to FIGS. 4 and 5. FIG. 4 is a flow chart showing a process of producing the semiconductor apparatus in Example 2. In a method for producing the semiconductor apparatus in Example 1, the semiconductor element to which the conductive adhesive is transferred in advance is positioned on the circuit substrate with its face down. After that, the step of deforming the projected electrode plastically and that of mounting were conducted at the same time by applying the pressure.

However, according to a method for producing the semiconductor apparatus in Example 2, a semiconductor element which is positioned in advance on the circuit substrate with surface down is pressured to cause plastic deformation of the projected electrode. Then, the semiconductor element is once detached from the circuit substrate, the conductive adhesive is transferred and the semiconductor element is mounted with its face down again.

Figure 5A:
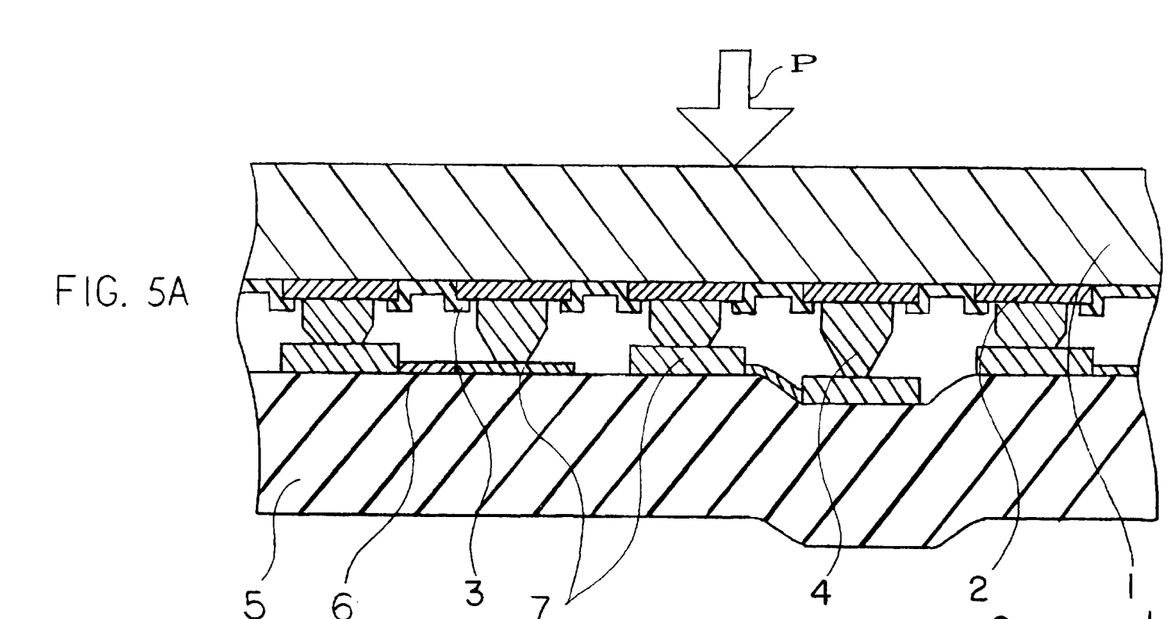
FIG. 5A is a sectional view showing a semiconductor apparatus in the step of mounting and the step of pressuring the semiconductor element in the process of producing a semiconductor apparatus shown in FIG. 4.
Figure 5B:
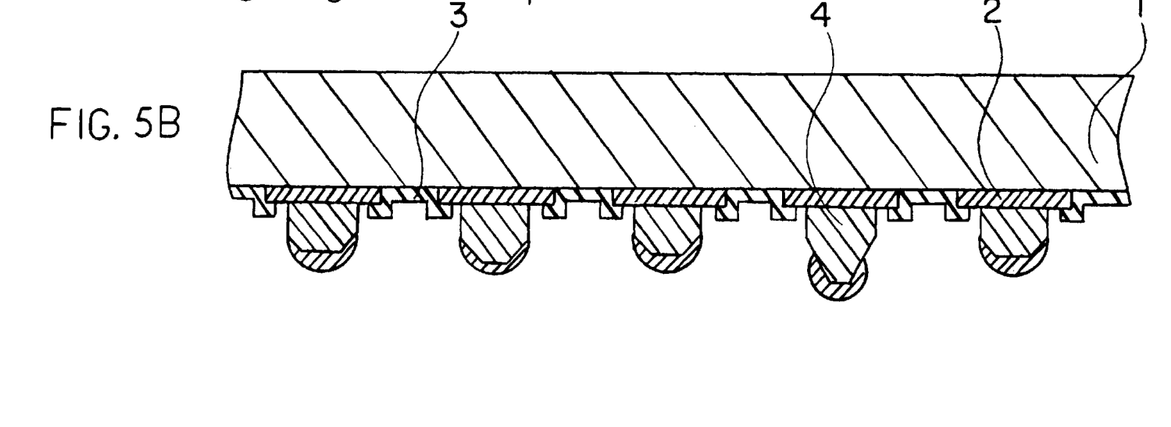
FIG. 5B is a sectional view showing a semiconductor apparatus in the step of transferring the conductive adhesive.

FIG. 5 is a figure explaining from a step of mounting with its face down (1) to a step of transferring the conductive adhesive in the producing process as shown in FIG. 4. The reference number used in FIG. 5 is same as that used in FIG. 1. FIG. 5A is a sectional view showing a semiconductor apparatus from a step of mounting to a step of pressuring the semiconductor element in the process of producing a semiconductor apparatus as shown in FIG.4. FIG. 5B is a sectional view showing a semiconductor apparatus in the step of transferring the conductive adhesive.

As shown in FIG. 5A, the semiconductor element 1 is positioned at the predetermined part of the circuit substrate 5 with its face down and the pressure P is applied to the back of the semiconductor element 1. Consequently, the appropriate plastic deformation of the projected electrode 4 is conducted.

Next, the semiconductor element 1 is once detached from the circuit substrate 5, as shown in FIG. 5B, and the required amount of the conductive adhesive is transferred only to the vertex of the projected electrode 4. After that, the semiconductor element 1 is mounted again on the predetermined part of the circuit substrate 5 with its face down. As above-mentioned, the semiconductor apparatus having the constitution which is substantially uniform like that shown in FIG. 1 can be produced.

According to the method for producing the semiconductor apparatus in Example 1, when the semiconductor element is mounted, the pressure is applied. As a result, the position of the semiconductor element and the circuit substrate may be shifted from that of the predetermined position of the semiconductor element and the circuit substrate. On the other hand, according to the method for producing the semiconductor apparatus in Example 2, when the semiconductor element is mounted, the pressure is hardly applied to the semiconductor element at all. Therefore the possibility that the position of the semiconductor element and the circuit substrate is shifted from that of the predetermined position of the semiconductor element and the circuit substrate is small. Consequently, the method for producing the semiconductor apparatus in Example 2 is suitable for producing the semiconductor apparatus requiring mounting accuracy such as minute pitch connecting construction.

EXAMPLE 3

Figure 6:
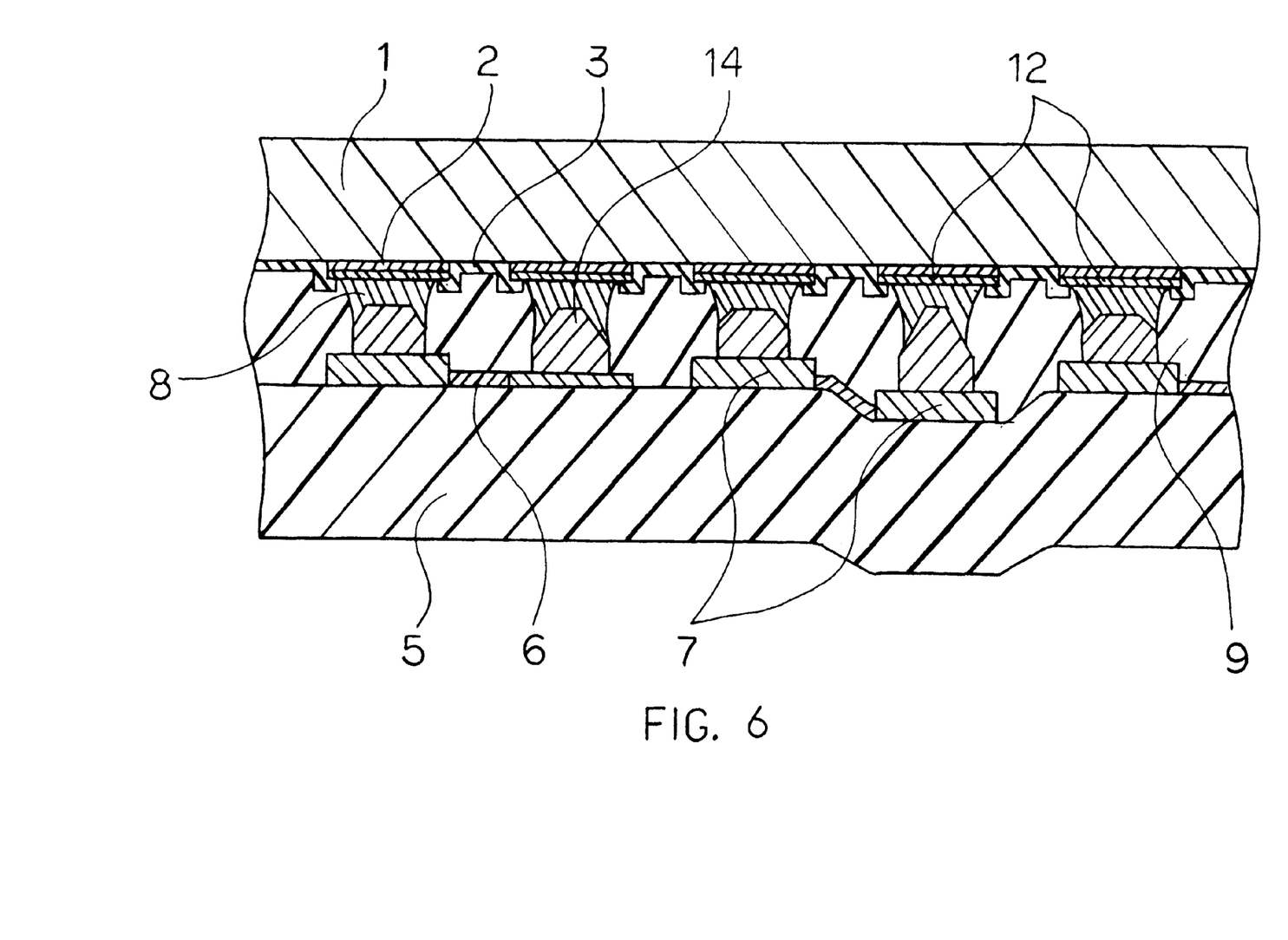
FIG. 6 is a sectional view showing a semiconductor apparatus in Example 3.

A method for producing the semiconductor apparatus in Example 3 will be explained referring to FIGS. 6, 7 and 8. FIG. 6 is a sectional view showing a semiconductor apparatus in Example 3. In FIG. 6, 12 indicates a barrier layer composed of Cr or Au formed on the surface of the aluminum electrode and 14 indicates a projected electrode formed on the electrode terminal at the side of the circuit substrate. The other elements are the same as those of FIG. 1.

Unlike the semiconductor apparatus of Example 1 shown in FIG. 1, in the semiconductor apparatus of Example 3, a barrier layer 12 is formed because the aluminum may be corroded when a conductive adhesive is contacted directly with the surface of the aluminum electrode terminal 2. Further, in the semiconductor apparatus of Example 3, a projected electrode 14 composed of conductive metallic material such as Au or Cu and the like is formed on the surface of the electrode terminal 7 at the side of the circuit substrate 5.

As shown in FIG. 6, the height of the projected electrode 14 is processed according to the position in the direction of the height of the electrode terminal 7 formed on the circuit substrate 5 respectively in the same way as the semiconductor apparatus of Example 1 was produced. That is, there is the irregularity of the flat accuracy of the principal surface of the circuit substrate 5 and the film thickness accuracy of the electrode terminal 7. Consequently, the irregularity of the position of the electrode terminal 7 in the direction of the height of the protruding surface is caused. The height of the projected electrode 14 is lowered by plastic deformation in accordance with the irregularity respectively. In this case, the irregularity of the height of the projected electrode 14 which is pre-deformed plastically is smaller than that of the position of the electrode terminal 7 in the direction of height of the protruding surface, and the height is constant substantially. Consequently, the amount of the change of the height of the projected electrode 14 caused by plastic deformation is different based on the position in the direction of the height of the electrode terminal 7 in the direction of the protruding surface. Concretely, when the distance between the protruding surface of the electrode terminal 7 and the semiconductor element 1 is shorter, the amount of change of height of the projected electrode 14 becomes larger.

As a result, the distance between the surface of the barrier layer 12 at the side of the semiconductor element 1 and the protruding surface of the projected electrode 14 becomes uniform. It is preferable that the distance is in a range of 1 μm to 10 μm in the same way as Example 1. It is more preferable that the distance is about 5 μm. Consequently, the junction layer composed of conductive adhesive 8 which is transferred on the vertex of the projected electrode 14 reaches reliably the surface of the barrier layer 12 at the side of the semiconductor element 1 and as a result, the electrical connecting failure can be prevented.

Next, a method for producing the semiconductor apparatus in Example 3 will be explained referring to FIGS. 7 and 8. FIG. 7 is a flow chart showing the process of producing the semiconductor apparatus in Example 3. As shown in FIG. 7, an element is formed on the surface of semiconductor element 1 and after that a barrier layer 12 is formed by layering Cr and Au on the surface of the aluminum electrode terminal 2 with a plating technique. Then, the inspection is conducted and the semiconductor wafer is cut into individual semiconductor elements 1.

On the other hand, a desired circuit pattern 6 and an electrode terminal 7 are formed on the principal surface of the circuit substrate 5 and after that a projected electrode 14 composed of Au is formed on the surface of the electrode terminal 7 with a ball bonding technique.

Then, the projected electrode 14 is pushed onto the flat plate having a desired flatness accuracy and composed of hard material. Consequently, the appropriate plastic deformation of the projected electrode 14 is conducted and the height of the protruding surface of the projected electrode 14 becomes uniform respectively. After that, the required amount of the conductive adhesive paste 8 is transferred only to the vertex of the projected electrode 14, the semiconductor element 1 is mounted on the predetermined part of the circuit substrate 5 with its face down, heat treatment is applied to the conductive adhesive 8 to be hardened, electrical inspection is carried out to confirm the normal action, and finally the space between the semiconductor element 1 and the circuit substrate 6 is filled with insulating resin 9 such as liquid epoxy based resin. According to the above-mentioned steps, the semiconductor apparatus is produced.

Figure 7:
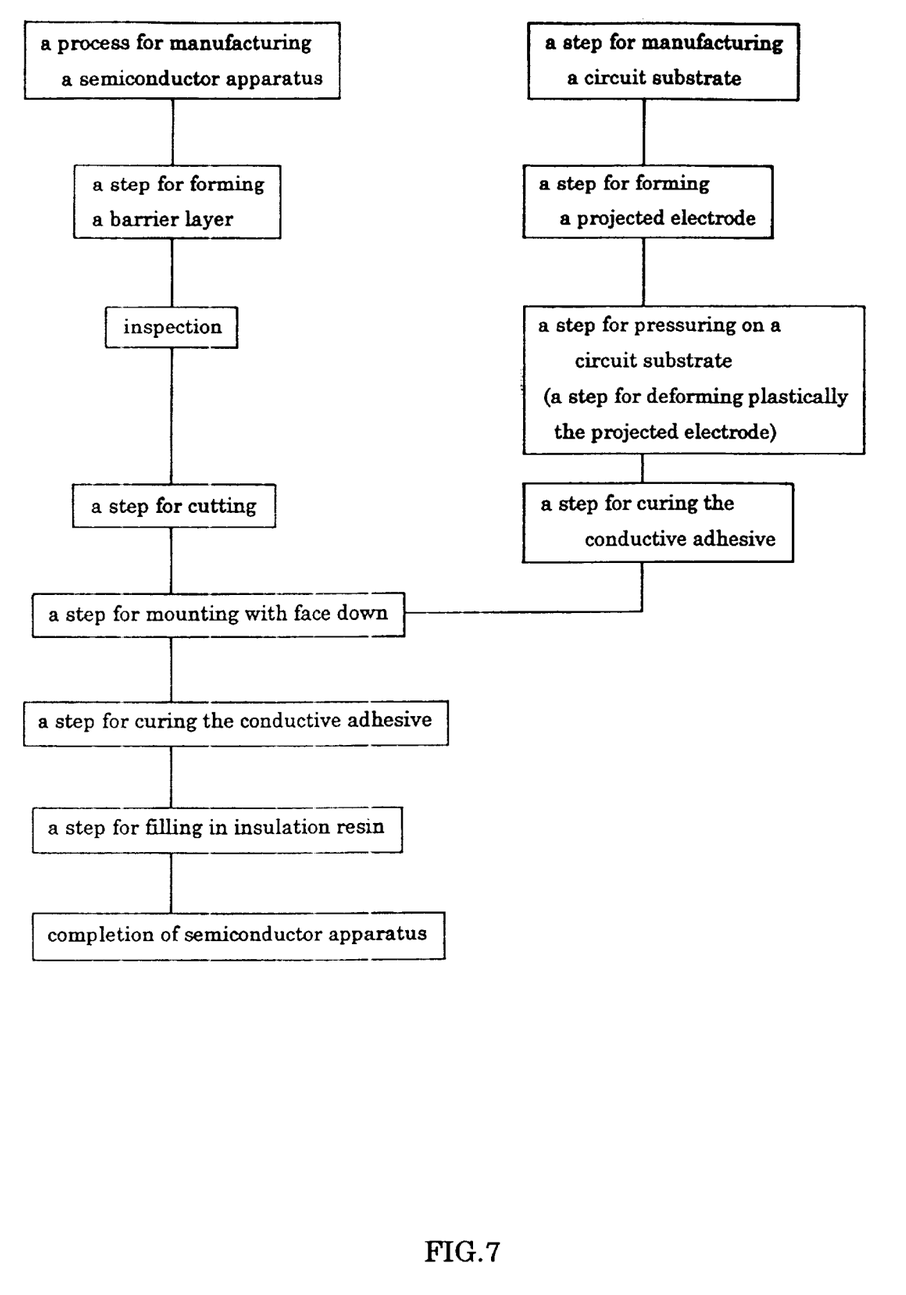
FIG. 7 is a flow chart showing the process of producing the semiconductor apparatus in Example 3.
Figure 8A:
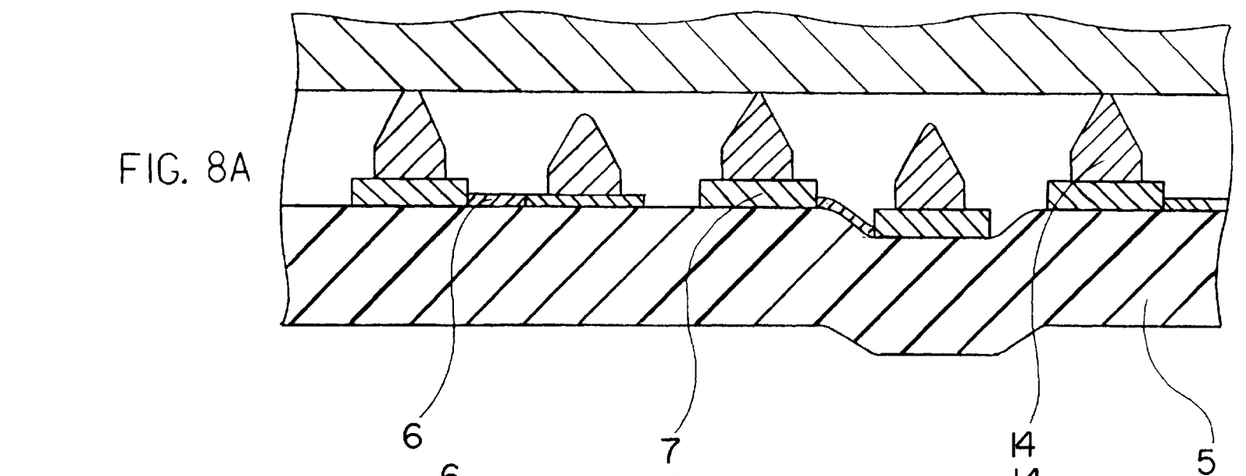
FIG. 8A is a sectional view showing a semiconductor apparatus prior to pressuring the circuit substrate in the step of pressuring the circuit substrate shown in FIG. 7.
Figure 8B:
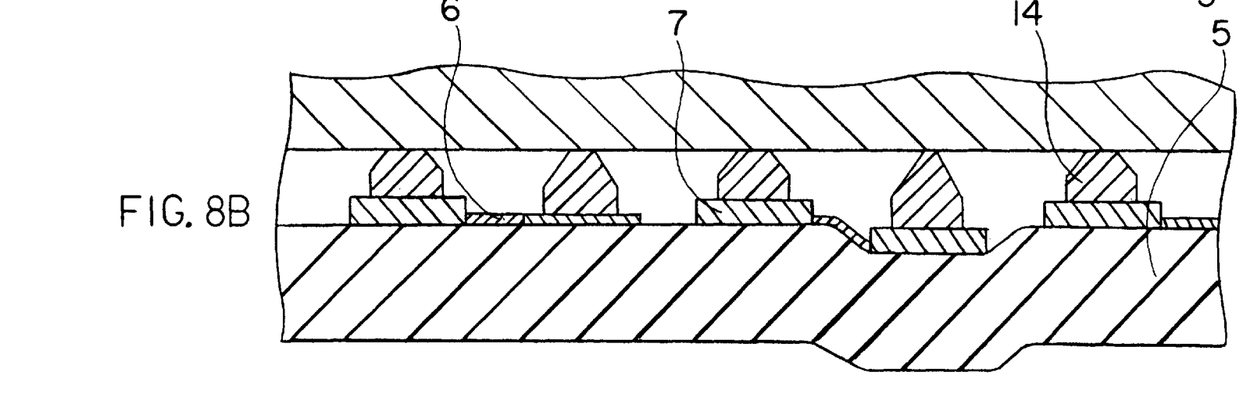
FIG. 8B is a sectional view showing a semiconductor after the circuit substrate is pressured.

FIG. 8 is a figure explaining from a step of pressuring the circuit substrate to a step of transferring the conductive adhesive in the process of producing a semiconductor apparatus as shown in FIG. 7. The reference number used in FIG. 7 is same as that used in FIG. 6. FIG. 8A is a sectional view showing a semiconductor apparatus prior to pressuring the circuit substrate. FIG. 8B is a sectional view showing a semiconductor after the circuit substrate is pressured. As shown in FIG. 8A, the projected electrode 14 which is formed on the principal surface of the circuit substrate 5 is pushed to the flat plate having a desired flat accuracy and composed of hard material. Consequently, the appropriate plastic deformation of the projected electrode 14 is conducted and the height of the protruding surface of the projected electrode 14 is unified. It is preferable that the variation in flatness of the above-mentioned hard material is 4 μm or less over a distance of 20 mm. It is preferable that the pressure which is applied to the flat plate composed of hard material is in a range of $1.5 \times 10^8$ to $5.0 \times 10^8$ N/M$^2$ at the protruding surface of the projected electrode 4. Then, as shown in FIG. 8B, the conductive adhesive 8 paste is transferred only to the vertex of the projected electrode 14 and the semiconductor element 1 is mounted.

Furthermore, a projected electrode 14 may be formed by the transferring bump technique in which the surface of the electrode terminal 7 is pushed by the block of the conductive metallic material such as Au or Cu and the like which is produced in advance, and then, pressure, heat or ultrasonic vibration is applied to attach the block of the conductive metallic material to the surface of the electrode terminal 7.

Furthermore, a projected electrode 14 may be formed by depositing the conductive metallic material on the electrode terminal 7 by electroless plating or electrolytic plating.

Furthermore, a technique of forming a thick film using paste may be used. Regarding the barrier layer 12, a material other than Cr-Au film may be used.

Furthermore, in a case when an aluminum electrode terminal 2 is composed of material except for aluminum which is not corroded easily such as Au or Pt and the like, the barrier layer is not required to be formed.

As above-mentioned, according to the method for producing the semiconductor apparatus in Example 3, the step of pressuring the semiconductor element can be omitted, therefore the damage which is inflicted on the semiconductor element is reduced. In particular, when the semiconductor element is produced by using the brittle material such as compound semiconductor, Ga—As, the method for producing semiconductor apparatus in Example 3 is very effective.

As above-mentioned, according to the semiconductor apparatus of this invention, the height of the projected electrode is processed appropriately to unify the distance between the protruding surface of the projected electrode and the opposing surface of the individual electrode via the above-mentioned conductive adhesive respectively. Consequently, the electrical connection between the semiconductor element and the circuit substrate can be made reliably.

Further, according to the method for producing the semiconductor apparatus of this invention, the height of the projected electrode can be processed appropriately to unify the distance between the protruding surface of the projected electrode and the opposing surface of the individual electrode terminal via conductive adhesive respectively by applying the pressure to the back of the semiconductor element. Consequently, a semiconductor apparatus in which the semiconductor element and the circuit substrate are electrically connected reliably can be produced easily and at a low cost.

INDUSTRIAL APPLICABILITY

As above-mentioned, the semiconductor element and the circuit substrate are electrically connected reliably in the semiconductor apparatus of this invention, the semiconductor apparatus of this invention can be used as a semiconductor apparatus in which the semiconductor element and the circuit substrate are electrically connected.

Further, according to a method for producing the semiconductor apparatus of this invention, each projected electrode can be deformed plastically and the semiconductor element and circuit substrate can be electrically connected reliably. Consequently, the method for producing the semiconductor apparatus of this invention can be utilized as a method for producing a semiconductor apparatus in which a flip-chip packaging technique is used.

What is claimed is:

1. A semiconductor apparatus in which a flip-chip packaging technique is used for connecting electrically a semiconductor element and a circuit substrate via a projected electrode composed of conductive metallic material formed on an electrode terminal which is formed on the surface of said semiconductor element where the element is formed, a conductive adhesive and an electrode terminal on said circuit substrate, wherein said individual projected electrode is deformed plastically in the direction of height in accordance with the height of an opposing surface of said electrode terminal formed on said circuit substrate in the part of said circuit substrate where the height of the surface of said electrode terminal is different so that the distance between a protruding surface of said individual projected electrode and an opposing surface of said individual electrode terminal formed on said circuit substrate via said conductive adhesive is unified.

2. The semiconductor apparatus according to claim 1 wherein the material of said projected electrode is at least one metallic material selected from the group consisting of Au and Cu.

3. The semiconductor apparatus according to claim 1 wherein a distance between the protruding surface of said individual projected electrode and the opposing surface of the individual electrode terminal via said conductive adhesive is in a range of 1 μm to 10 μm.

4. A semiconductor apparatus where a flip-chip packaging technique is used for connecting electrically a semiconductor element and a circuit substrate via an electrode terminal formed on the surface of said semiconductor element where the element is formed, a conductive adhesive and a projected electrode composed of conductive metallic material formed on an electrode terminal on said circuit substrate, wherein said individual projected electrode is processed in the direction of height in accordance with a height of an opposing surface of the electrode terminal formed on said circuit substrate, in the part of said circuit substrate where the height of the surface of electrode terminal is different so that the distance between a protruding surface of said individual projected electrode and an opposing surface of said individual electrode terminal formed on the surface of said semiconductor element where the element is formed via said conductive adhesive is unified.

5. The semiconductor apparatus according to claim 4 wherein a barrier layer composed of conductive metallic laminated film is formed on said electrode terminal on the surface of said semiconductor element where the element is formed.

6. The semiconductor apparatus according to claim 4 wherein the height of projection of said projected electrode is substantially uniform.

7. The semiconductor apparatus according to claim 6 wherein the height of the protruding surface of said individual projected electrode is unified by pushing said projected electrode on a flat surface of a hard material before said projected electrode is bonded with conductive adhesive.

8. The semiconductor apparatus according to claim 7 wherein the pressure on said protruding surface of said projected electrode which is caused by pushing on the flat surface of said hard material is in a range of $1.5 \times 10^8$ to $5.0 \times 10^8$ N/m².

9. The semiconductor apparatus according to claim 7 wherein the variation in flatness of said hard material is 4 μm or less over a distance of 20 mm.

10. A method for producing the semiconductor apparatus, comprising the steps of forming a projected electrode on a surface of a semiconductor element where the element is formed, transferring a conductive adhesive to the vertex of said projected electrode and mounting said semiconductor element on a circuit substrate with face down, wherein in the part of said circuit substrate where the height of the surface of electrode terminal is different, in said step of mounting, said semiconductor element is pushed from the back so that the projected electrode formed on said semiconductor element is deformed plastically in the direction of height in accordance with the height of the opposing surface of said electrode terminal formed on said circuit substrate to unify the distance between the protruding surface of said individual projected electrode formed on said semiconductor element and the opposing surface of the individual electrode terminal at the side of said circuit substrate.

11. The method for producing the semiconductor apparatus according to claim 10, wherein the pressure on the protruding surface of said projected electrode, which is caused by pushing said semiconductor element from the back is in a range of $1.5 \times 10^8$ to $5.0 \times 10^8$ N/M².

12. The method for producing the semiconductor apparatus according to claim 10, wherein the projected electrode on the semiconductor element is deformed plastically, the conductive adhesive is transferred to the vertex of the individual projected electrode on the semiconductor element and said semiconductor element is mounted on said circuit substrate with its face down again.

13. A method for producing a semiconductor apparatus comprising the steps of forming a projected electrode on an electrode terminal formed on a circuit substrate, processing said individual projected electrode in the direction of height to unify the distance between a protruding surface of said individual projected electrode formed on said circuit substrate and an opposing surface of an electrode terminal formed on a semiconductor element in the part of said circuit substrate where the height of the surface of electrode terminal is different, transferring a conductive adhesive to the vertex of said individual projected electrode and mounting said semiconductor element on said circuit substrate with face down.

14. The method for producing the semiconductor apparatus according to claim 13, wherein the height of the protruding surface of said individual projected electrode is unified by pushing said projected electrode to a flat surface of a hard material before said projected electrode is bonded with adhesive.

15. The method for producing the semiconductor apparatus according to claim 14, wherein the pressure which is caused by pushing said projected electrode to the flat surface of said hard material is in a range of $1.5 \times 10^8$ to $5.0 \times 10^8$ N/m².

16. The method for producing the semiconductor apparatus according to claim 14, wherein the variation in flatness of said hard material is 4 μm or less over a distance of 20 mm.

17. The semiconductor apparatus according to claim 4, wherein the material of said projected electrode is at least one metallic material selected from a group consisting of Au and Cu.

18. The method semiconductor apparatus according to claim 4, wherein the distance between the protruding surface of said individual projected electrode and the opposing surface of said individual electrode terminal via said conductive adhesive is in a range of 1 μm to 10 μm.

* * * * *